United States Patent
Ganor

(10) Patent No.: US 9,673,820 B2
(45) Date of Patent: Jun. 6, 2017

(54) LOW LATENCY GLITCH-FREE CHIP INTERFACE

(71) Applicant: DSP Group LTD.

(72) Inventor: Assaf Ganor, Herzeliya (IL)

(73) Assignee: DSP GROUP LTD., Herzliya (IL)

( * ) Notice: Subject to any disclaimer, the term of this patent is extended or adjusted under 35 U.S.C. 154(b) by 133 days.

(21) Appl. No.: 14/697,644

(22) Filed: Apr. 28, 2015

(65) Prior Publication Data

US 2015/0333739 A1 Nov. 19, 2015

Related U.S. Application Data

(60) Provisional application No. 61/984,896, filed on Apr. 28, 2014.

(51) Int. Cl.
| | | |
|---|---|---|
| *H04L 7/00* | (2006.01) | |
| *H04L 5/00* | (2006.01) | |
| *H03K 19/0185* | (2006.01) | |
| *H03K 3/012* | (2006.01) | |
| *H03K 3/013* | (2006.01) | |
| *H03K 3/037* | (2006.01) | |
| *H03K 19/20* | (2006.01) | |
| *H03K 5/00* | (2006.01) | |

(52) U.S. Cl.
CPC ..... *H03K 19/018507* (2013.01); *H03K 3/012* (2013.01); *H03K 3/013* (2013.01); *H03K 3/037* (2013.01); *H03K 5/00* (2013.01); *H03K 19/20* (2013.01); *H03K 2005/00013* (2013.01)

(58) Field of Classification Search
CPC .......... H03K 19/20; H03K 19/018507; H03K 3/037; H03K 5/00; H03K 3/012; H03K 3/013; H03K 2005/00013
See application file for complete search history.

(56) References Cited

U.S. PATENT DOCUMENTS

| | | | | |
|---|---|---|---|---|
| 5,522,048 A | * | 5/1996 | Offord | H04L 7/02 375/354 |
| 8,898,554 B2 | * | 11/2014 | Lee | G06F 11/08 714/48 |
| 2011/0175758 A1 | * | 7/2011 | Iqbal | H03K 5/1252 341/94 |
| 2014/0036904 A1 | * | 2/2014 | Mutou | H04L 7/042 370/350 |

* cited by examiner

*Primary Examiner* — Zahid Choudhury
(74) *Attorney, Agent, or Firm* — Reches Patents

(57) ABSTRACT

A scheme is described that provides for a low latency, glitch free chip interface that does not require a clock. This invention handles input transitions that are skewed and also input transitions that are momentary. A change in an input state initiates a pulse that propagates through the system and samples the new input state after a delay. If there is a difference between the sampled input state and the present input state, then a new pulse is initiated in order to avoid any illegal transitions at the output.

18 Claims, 12 Drawing Sheets

LOW LATENCY GLITCH-FREE CHIP INTERFACE

RELATED APPLICATIONS

This patent application claims priority from U.S. provisional patent Ser. No. 61/984,896 filing date Apr. 28, 2014 which is incorporated herein by reference.

FIELD OF THE INVENTION

This invention relates to the field of integrate circuit.

BACKGROUND TO THE INVENTION

In many integrated circuits there is the need to control numerous states. The chip interface is a module in the integrated circuit that translates the input conditions that are visible outside of the chip, to the selection of particular states within the chip that correspond to the deterministic state required. An example is that of a radio front end module that consists of a selection of switches, power amplifiers and low noise amplifiers. A setting of the input controls that relate to a receive or a transmit function, require that a set combination of switch settings and the enabling of the required amplifiers is accomplished.

In FIG. 1, the concept of the chip interface is shown. The master chip 101 is provided with the desired controls and the chip interface block 103 of chip 100 translates the input signals into a set of control logic signals that select the required modules (module-1 105, module-2 106 till module-N 109).

An example of a simple chip interface 110 is given in FIG. 2. FIG. 2 illustrates a simple chip interface where each input control is directly connected to a specific function within the chip. In this example, setting the control input CNTRL 0 to a 1 might relate to the enabling of the low noise amplifier (LNA 111) and setting the control CNTRL 1 to a zero might select the antenna switch 112 so as to connect the antenna to the input of the LNA. This would be the settings for the receive function and might correspond to also setting CNTRL 2 to a zero. Similarly, in order to select the transmit function CNTRL 0 will be a zero and CNTRL 1 a 1 so as to select the output of the power amplifier (PA 113) to the antenna. In this case, CNTRL 2 would be set to a 1 in order to enable the PA.

More common would be the case where the Control Block (such as control block 121 of FIG. 3) also contains a decoder. In our example above, we have just two states, receive and transmit. Table A below shows the required logic states of the three outputs in order to set up the desired states of receive or transmit. A decoder block (denoted decoder 122 in FIG. 3) translates the two control inputs into the required settings of the three output signals to control LNA 111, antenna switch 112 and PA 113. This is shown in FIG. 3.

TABLE A

Logic Truth Table for Receive and Transmit states

|  | Enable LNA | Antenna Switch | Enable PA |
|---|---|---|---|
| Receive | ON (1) | RX position (0) | OFF (0) |
| Transmit | OFF (0) | TX Position (1) | ON (1) |

In comparing FIGS. 1 and 2 it is seen that three input control pins is reduced to two. This can be expanded and it is common practice to decode a number of chip interfaces using a decoder block so as to reduce the number of pins required on the chip.

The challenge that arises when using a decoder block in order to reduce the pin count is that in many applications the time between the changes of the input state and the change of the output states must be low and also that any transient conditions of the output states must be avoided so as to not allow any illegal combinations even for a short time. In the example of a wireless front end module, the switching time between receive and transmit needs to be in the order of 10s of nanoseconds. The traditional method to achieve this fast change time is to use very high clock speeds in the order of 10s of MHz and this adds complexity, power consumption, chip area and noise to the system.

Other challenges must be met. When the input state is changing there can be a skew between the transition times of the various input signals and hence it is necessary to sample the new state only after the input states have stabilized. In order to avoid glitches in the output signals all the output signals must be changed at the same time so as to avoid illegal combinations.

SUMMARY OF THE INVENTION

According to an embodiment of the invention there may be provided a semiconductor chip (chip) that may include: input terminals, a chip interface and chip modules that differ from the chip interface; wherein the chip interface may include an asynchronous monitor, logic, a sampling unit, a delay unit and a controller; wherein the asynchronous monitor may be configured to detect a change in a state of input signals conveyed over the input terminals and to generate a first pulse; wherein the delay unit may be configured to generate, at a first delay period after a reception of the first pulse, a first sampling pulse; wherein the logic may be configured to decode the input signals, to provide output signals that may be indicative of configurations of the chip modules; wherein the sampling unit may be configured to sample, in response to the first sampling pulse, a state of the input signals to provide a first sampled state of the input signals; wherein the delay unit may be configured to generate, at a second delay period after the generation of the first sampling pulse, a second sampling pulse; wherein the sampling unit may be configured to sample, in response to the second sampling pulse, (i) the state of the input signals to provide a second sampled state of the input signals, and (ii) a state of the output signals to provide a first sampled state of the output signals; wherein the controller may be configured to (i) compare between the first sampled state of the input signals and the second sampled state of the input signals; and (ii) output the sampled state of the output signals only when the first sampled state of the input signals equals the second sampled state of the input signals.

The logic, the sampling unit and the controller may be asynchronous.

The asynchronous monitor may be configured to detect the change in a state of input signals by comparing each input signal to a delayed version of the input signal.

The chip interface may include multiple input paths and multiple output paths, wherein each input path of the multiple input paths may be allocated for a single input signal of the input signals; wherein each input path may include an exclusive OR (XOR) logical gate, an OR gate, a first flip-flop, a second flip-flop, a not-XOR (NXOR) gate and a path delay circuit; wherein each output path of the multiple output paths may be allocated for a single output signal of the output signals; wherein the multiple input paths, and an additional circuit form the asynchronous monitor, the sampling unit, the delay unit and the controller.

The additional circuit may include a first delay circuit that may be configured to introduce the first delay period; wherein each path delay circuit may be configured to introduce the second delay period; wherein the first delay circuit and path delay circuits of the multiple input paths form the delay unit.

The additional circuit may include an inverter that has an input that may be coupled to an output of the first delay circuit.

For each input path a first input of the XOR gate may be coupled to an input terminal that may be associated with the input path; a second input of the XOR may be coupled to an output of the path delay circuit; an output of the XOR gate may be coupled to a first input of the OR gate; a second input of the OR gate may be coupled to an output of the NXOR gate; an output of the OR gate may be coupled to an input of an additional circuit OR gate; a data port of the first flip-flop may be coupled to the input terminal that may be associated with the input path; an enable port of the first flip-flop may be coupled to an output of the first delay circuit; an output port of the first flip-flip may be coupled to a data port of the second flip-flop, to a first input of the NXOR gate and to an input port of the logic; wherein an enable port of the second flip-flop may be coupled to an output of the inverter; and wherein an output port of the second flip-flip may be coupled to a second input of the NXOR gate.

The logic may be configured to start decoding the input signals at a point in time that does not precede a time of generation of the first sampling pulse.

According to an embodiment of the invention there may be provided a chip that may include input terminals for conveying input signals, a chip interface and chip modules that differ from the chip interface; wherein the chip interface may include multiple input paths, multiple output paths, logic coupled between the multiple input paths and the multiple output paths, and an additional circuit; wherein each input path of the multiple input paths may be allocated for a single input signal of the input signals; wherein each input path may include an exclusive OR (XOR) logical gate, an OR gate, a first flip-flop, a second flip-flop, a not-XOR (NXOR) gate and a path delay circuit; wherein each output path of the multiple output paths may be allocated for a single output signal of the output signals; wherein the additional circuit may include a first delay circuit that may be configured to introduce a first delay period and inverter that has an input that may be coupled to an output of the first delay circuit; wherein each path delay circuit may be configured to introduce a second delay period; wherein the logic may be configured to decode the input signals to provide output signals that may be indicative of configurations of the chip modules; wherein for each input path: a first input of the XOR gate may be coupled to an input terminal that may be associated with the input path; a second input of the XOR may be coupled to an output of the path delay circuit; an output of the XOR gate may be coupled to a first input of the OR gate; a second input of the OR gate may be coupled to an output of the NXOR gate; an output of the OR gate may be coupled to an input of an additional circuit OR gate; a data port of the first flip-flop may be coupled to the input terminal that may be associated with the input path; an enable port of the first flip-flop may be coupled to an output of the first delay circuit; an output port of the first flip-flip may be coupled to a data port of the second flip-flop, to a first input of the NXOR gate and to an input port of the logic; wherein an enable port of the second flip-flop may be coupled to an output of the inverter; and wherein an output port of the second flip-flip may be coupled to a second input of the NXOR gate The first flip-flop, the second flip flops and the logic may be asynchronous.

According to an embodiment of the invention there may be provided a that may include detecting, by an asynchronous monitor, a change in a state of input signals, the input signals may be conveyed over input terminals of a chip interface; generating, in response to the detecting of the change in the state of input signals, a first pulse; generating, by a delay unit and at a first delay period after a reception of the first pulse, a first sampling pulse; decoding the input signals to provide output signals that may be indicative of configurations of chip modules; sampling, by a sampling unit and in response to the first sampling pulse, a state of the input signals to provide a first sampled state of the input signals; generating, by the delay unit and at a second delay period after the generating of the first sampling pulse, a second sampling pulse; sampling, by the sampling unit and in response to the second sampling pulse, the state of the input signals to provide a first sampled state of the input signals; sampling, by the sampling unit and in response to the second sampling pulse, a state of the output signals to provide a sampled state of the output signals; comparing, by a controller, between the first sampled state of the input signals and the second sampled state of the input signals; and outputting the sampled state of the output signals only when the first sampled state of the input signals equals the second sampled state of the input signals; and wherein the asynchronous monitor, the delay unit and the sampling unit belong to a chip interface.

The decoding of the input signals may start at a point in time that does not precede a time of generation of the first sampling pulse.

DESCRIPTION OF DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE INVENTION

Figure 1:
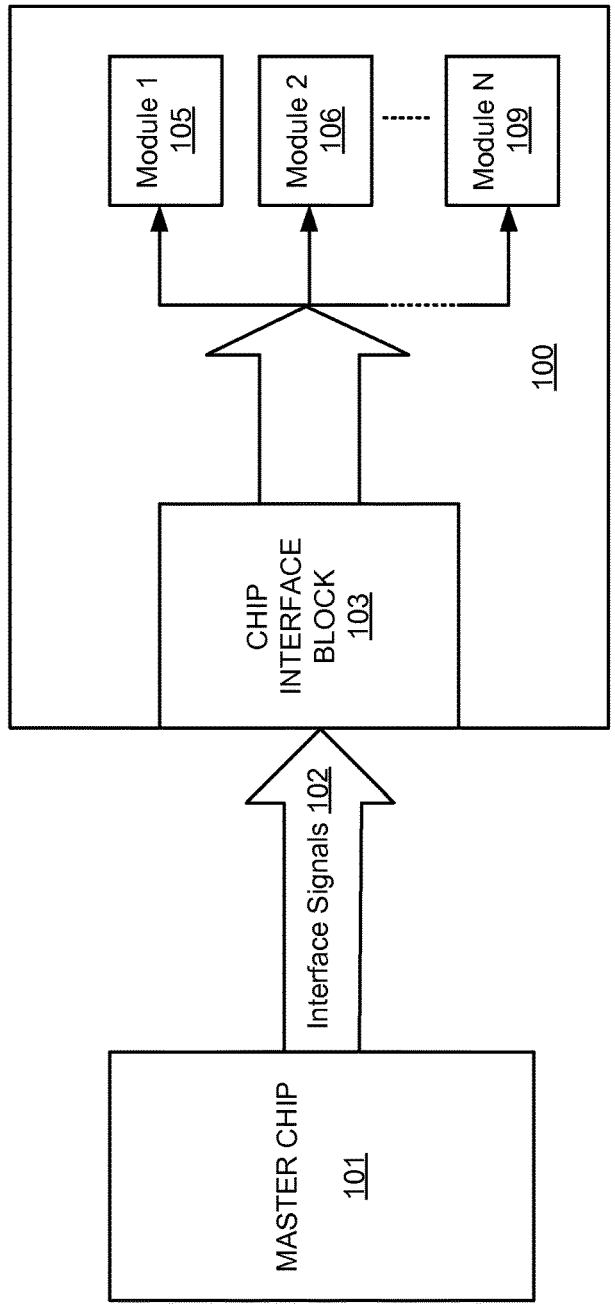
FIG. 1 illustrates a prior art chip interface.
Figure 2:
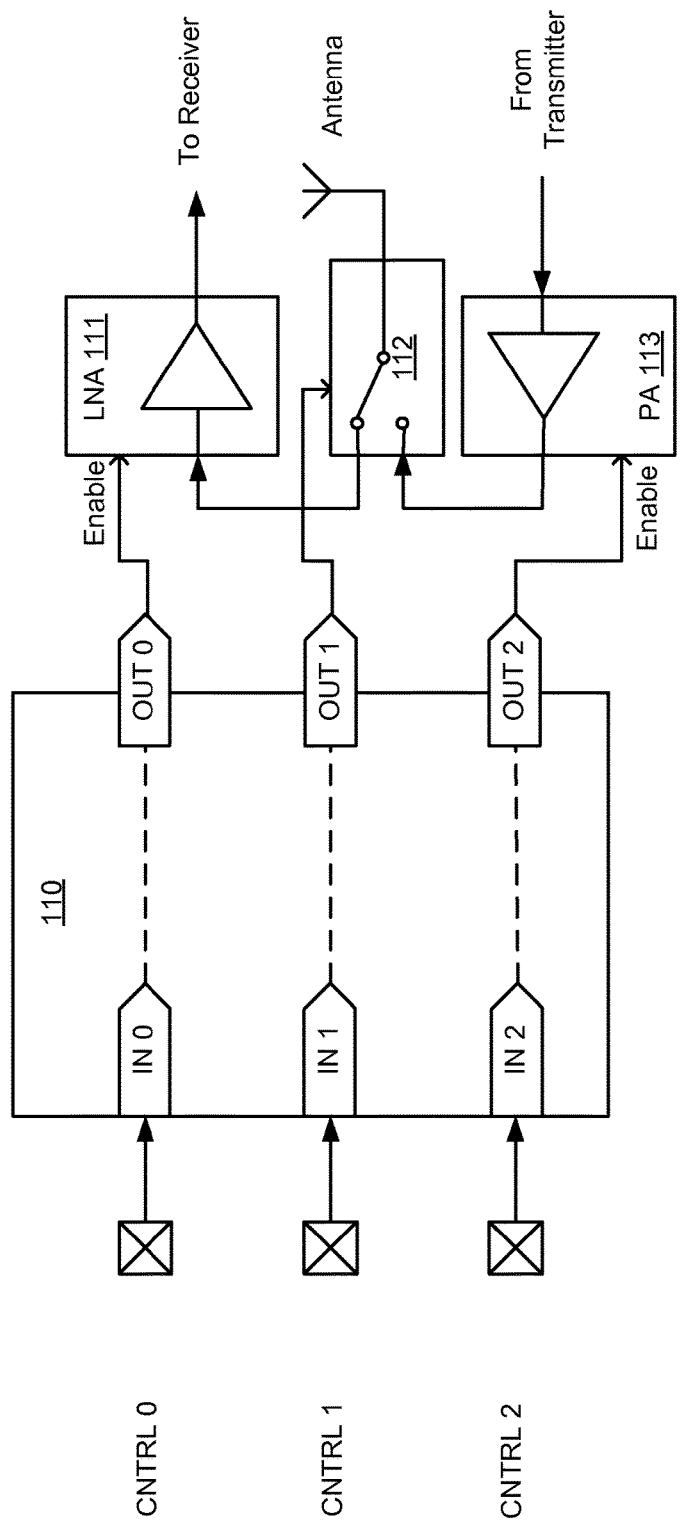
FIG. 2 illustrates a prior art chip interface.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

A scheme is described for a low latency, glitch free chip interface using a decoder control block that does not require a clock. A change in an input state initiates a pulse that after a delay causes the new input state to be sampled. The pulse is then de-asserted once the new input state has been sampled. After an additional delay, the output signals are sampled and the next output state determined. A further check is made by comparing the input state to the delayed sampled input state so as to check that the input did not change. If a change is detected, then an additional pulse is initiated that again, after an additional delay, causes the new input state to be sampled. The sampled input states are applied to the logic that decodes the input states to the output states and these are, in turn, sampled together with the sampled input state.

Figure 4:
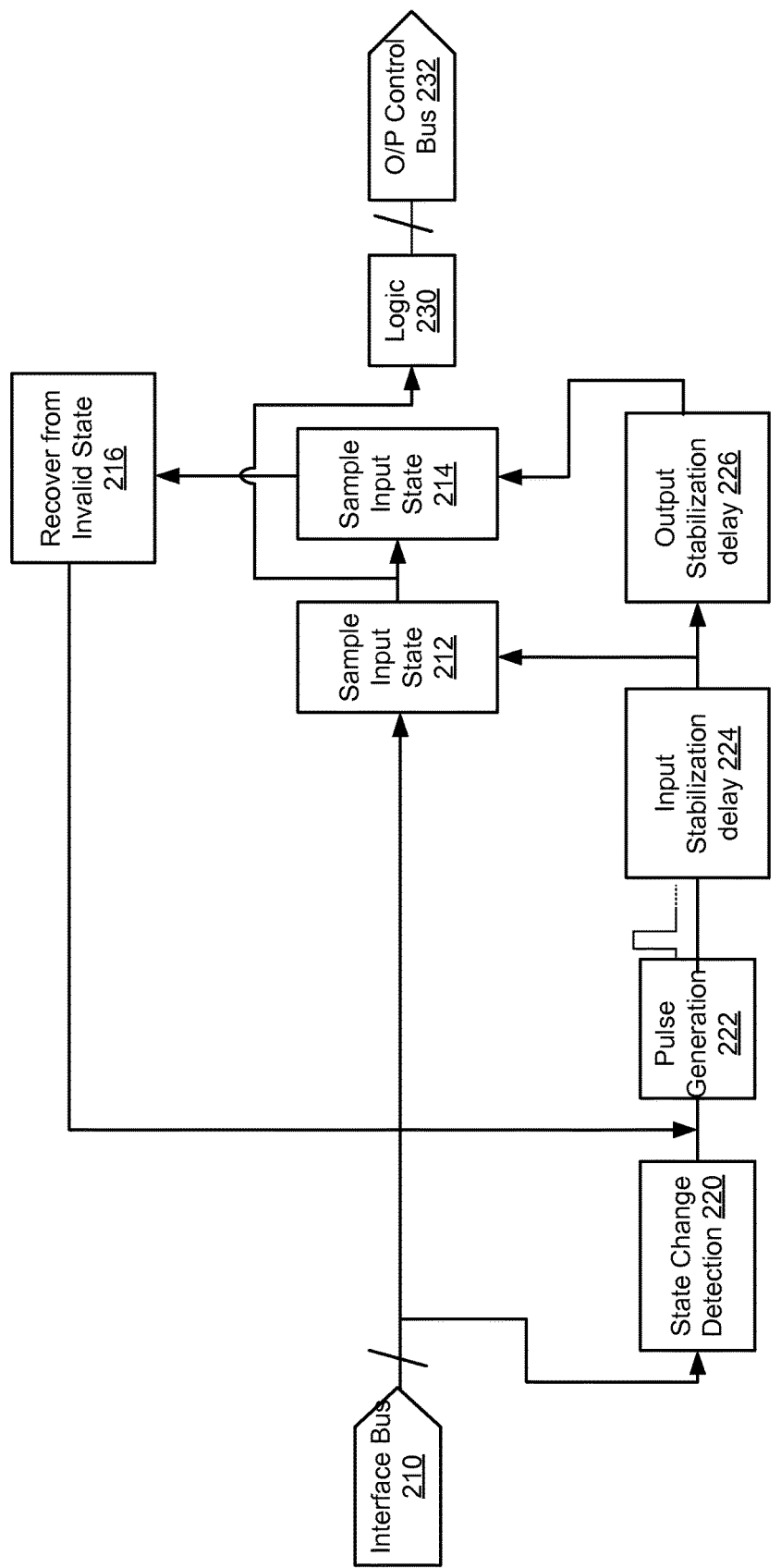
FIG. 4 illustrates various states of a chip interface according to an embodiment of the invention.

FIG. 4 illustrates states of a clock interface according to an embodiment of the invention.

Interface bus 210 is monitored to detect (state change detection 220) any change in the state of an input is detected and this generates a pulse (pulse generation 222). After a delay (input stabilization delay 226) to allow for input stabilization, the pulse is used to sample the input state (sample input state 212). The input state (after being sampled in box 212) is decoded (logic 230) to provide an output state that is then outputted—depending upon the validity of the input signal (especially—whether the input signals sampled at boxes 212 and 214 are equal to each other).

After a further delay (output stabilization delay 226) to allow for output stabilization, the input state is again sampled (sample input state 214) and if has changed then a new pulse is generated (recover from invalid state 216) so as to re-sample the input state. The sampled input state is applied to the decoder logic block which will generate the required outputs.

Because the input state is delayed and sampled, the output states are never set when an input state is in transition. Offsets of the timings for changes to the input states results in a single setting of the output states, thus any chance of an illegal state is avoided. This invention does not require a clock and uses standard logic blocks.

Figure 5:
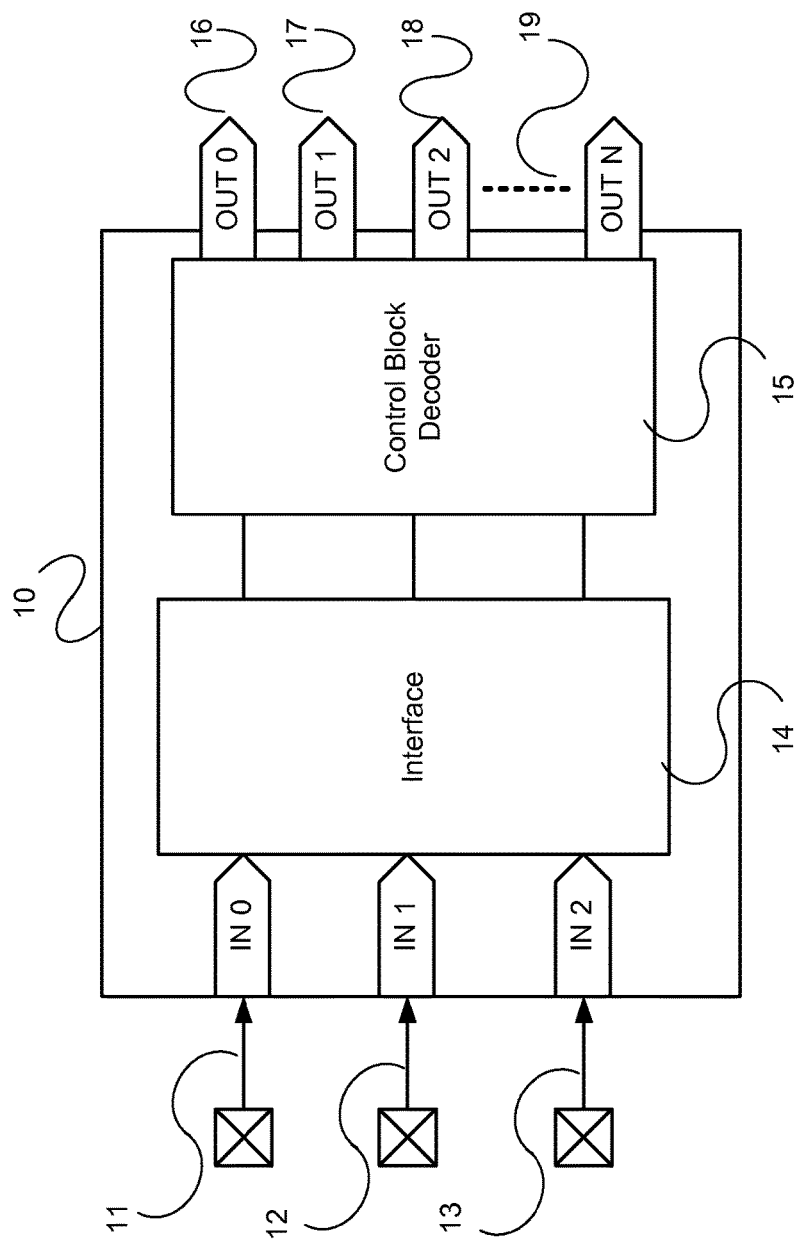
FIG. 5 illustrates a chip interface according to an embodiment of the invention.

FIG. 5 is a block schematic diagram of chip interface circuit 10 according to an embodiment of the invention.

Chip interface 10 decodes three inputs 11, 12 and 13 into a number of outputs 16, 17, 18, 19. The states of the three inputs 11, 12 and 13 are decoded into the required number of output states 16 to 19 by a control block decoder 15. The function of the interface 14 between the inputs 11, 12 and 13, and the control block decoder is to cater for any skew in the input states such that all the output signals 16 to 19 change together such that there is no crossings from one state to the next that traverses through a possible illegal set.

Figure 6:
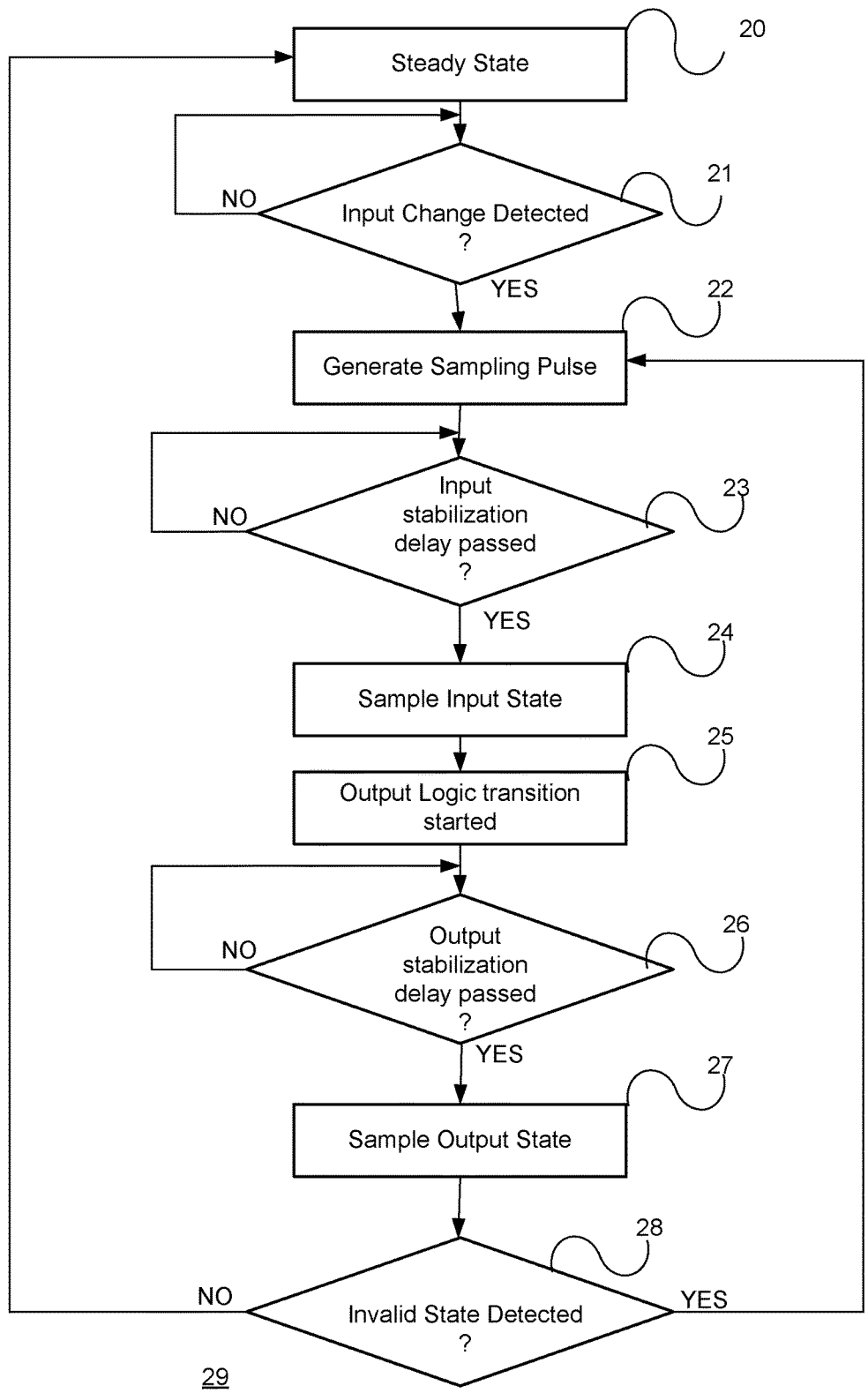
FIG. 6 is a flowchart of a method according to an embodiment of the invention.

FIG. 6 is a flowchart that describes the basic methodology used for the interface block shown in FIG. 5.

Any change from the steady state condition, step 20, is detected at step 21. If a change is detected at step 21 a pulse is generated at step 22. The pulse is then delayed in step 23. After this input stabilization delay in step 23 the state of the input is sampled in step 24 and then the output logic transition is started in step 25. Once the output stabilization delay has passed in step 26, the output state is sampled in step 27. A check is then carried out in step 28 to see if the sampled input state is still the same as the present input state. If it is not then in step 28 this is detected as an invalid state and a new sampling pulse is generated at step 22. If in step 28 the sampled input state is still the same as the present input state then the sequence returns to the steady state in step 20.

Figure 7:
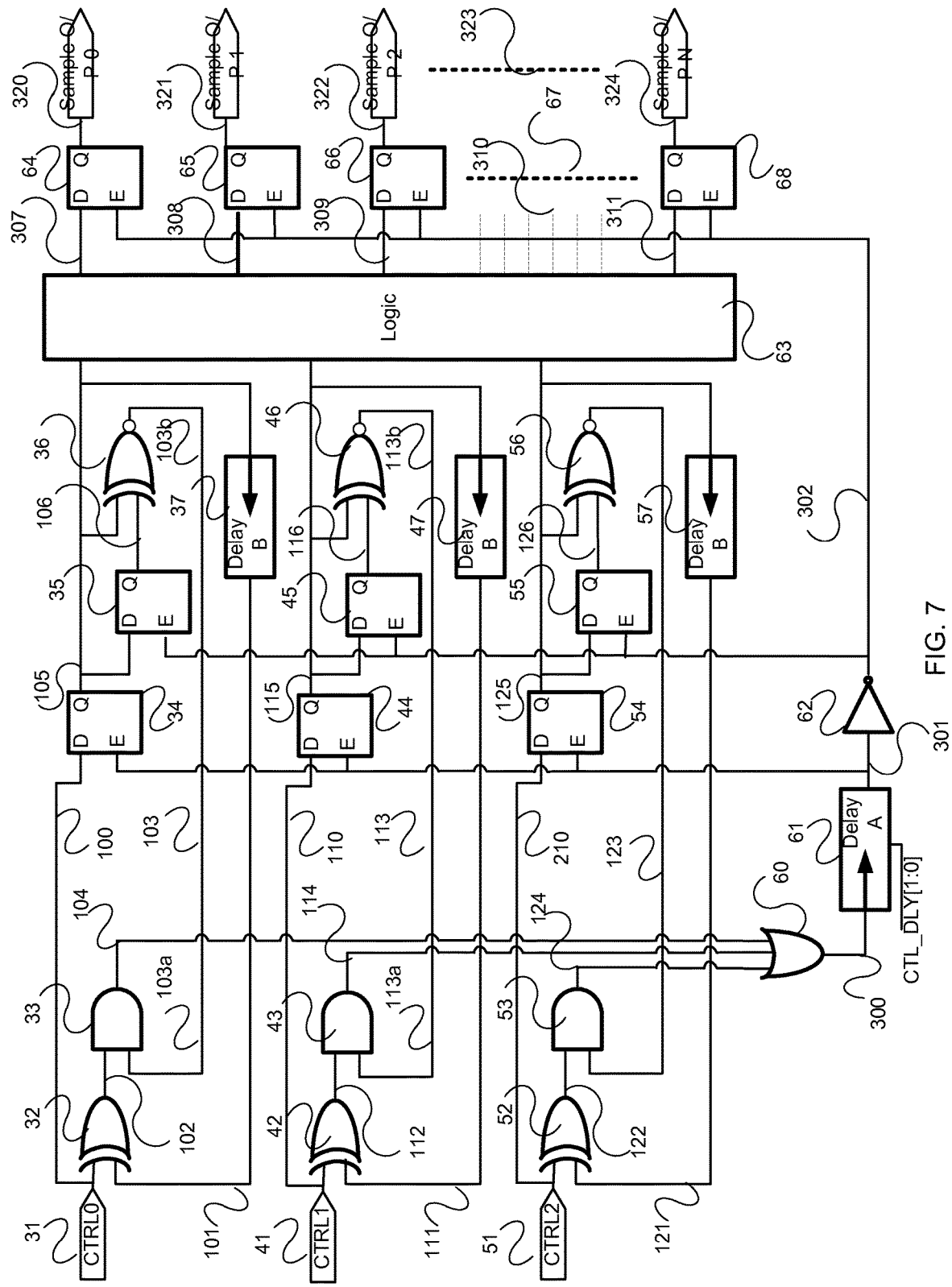
FIG. 7 illustrates a chip interface according to an embodiment of the invention.

FIG. 7 illustrates chip interface according to an embodiment of the invention. In FIG. 7 three inputs are shown 31, 41 and 51. The logic blocks 32, 33, 34, 35, 36 and 37 are specific to the input 31. Similarly the logic blocks 42, 43, 44, 45, 46 and 47 are specific to the input 41 and logic blocks 52, 53, 54, 55, 56 and 57 are specific to the input 51.

Input state CTRL 0, 31, is an input to an exclusive OR (EX-OR) gate 32. It is also connected to the input of D-Latch 34. The other input to EX-OR gate 32 is from the output of delay block 37. The output of EX-OR gate 32 is connected to one input of an AND gate 33. The other input to the AND gate 33 is from the output of exclusive NOR (EX-NOR) gate 36. The output of AND gate 33 is connected to one input of OR gate 60. Similarly, input state CTRL 1, 41, is an input to EX-OR gate 42. It is also connected to the input of D-Latch 44. The other input to EX-OR gate 42 is from the output of delay block 47. The output of EX-OR gate 42 is connected to one input of an AND gate 43. The other input to the AND gate 43 is from the output of EX-NOR gate 46. The output of AND gate 43 is connected to one input of OR gate 60. Similarly, input state CTRL 2, 51, is an input to EX-OR gate 52. It is also connected to the input of D-Latch 54. The other input to EX-OR gate 52 is from the output of delay block 57. The output of EX-OR gate 52 is connected to one input of an AND gate 53. The other input to the AND gate 53 is from the output of EX-NOR gate 56. The output of AND gate 43 is connected to one input of OR gate 60.

The output of OR gate 60 is connected to the input of delay block 61. The output of delay block 61 is connected to the enable inputs of the D-Latches 34, 44, 54, as well as to the input of the inverter 62. The output of the inverter 62 is connected to the enable inputs of D-Latches 35, 45, 55, and also to the inputs of the D-Latches 64, 65, 66, 67, 68. Reference 67 is used to denote a several D-Latches indicating that there may be any number of outputs, up to 8, in this example circuit.

The outputs of D-Latches 34, 44, and 45 are connected to the logic block 63 and also to the inputs of D-Latches 35, 45, 55 respectively, to the inputs of EX-NOR gates 36, 46, 56 respectively and also to the inputs of the delay blocks 37, 47, 57 respectively. The outputs from the logic block 63 are connected to the inputs of the D-Latches 64, 65, 66, 67, 68.

FIG. 7 also depicts the input and output signals at each logic block. References 100, 101, 102, 103, 104, 105, and 106 refer to the inputs and outputs specific to CTRL 0, 31. References 110, 111, 112, 113, 114, 115, and 116 refer to the inputs and outputs specific to CTRL 1, 41. References 120, 121, 122, 123, 124, 125, and 126 refer to the inputs and outputs specific to CTRL 2, 51. The output signal of OR gate 60 is 300, the output signal of delay block 61 is 301. The output of inverter 62 is 302. The outputs from the logic block 63 are 307, 308, 309, 310 and 311. Reference 312 is a number of output signals corresponding to the number of D-Latches 67. The output signals from D-Latches 64, 65, 66, 67 and 68 are 320, 321, 322, 323 and 324 respectively.

Figure 8:
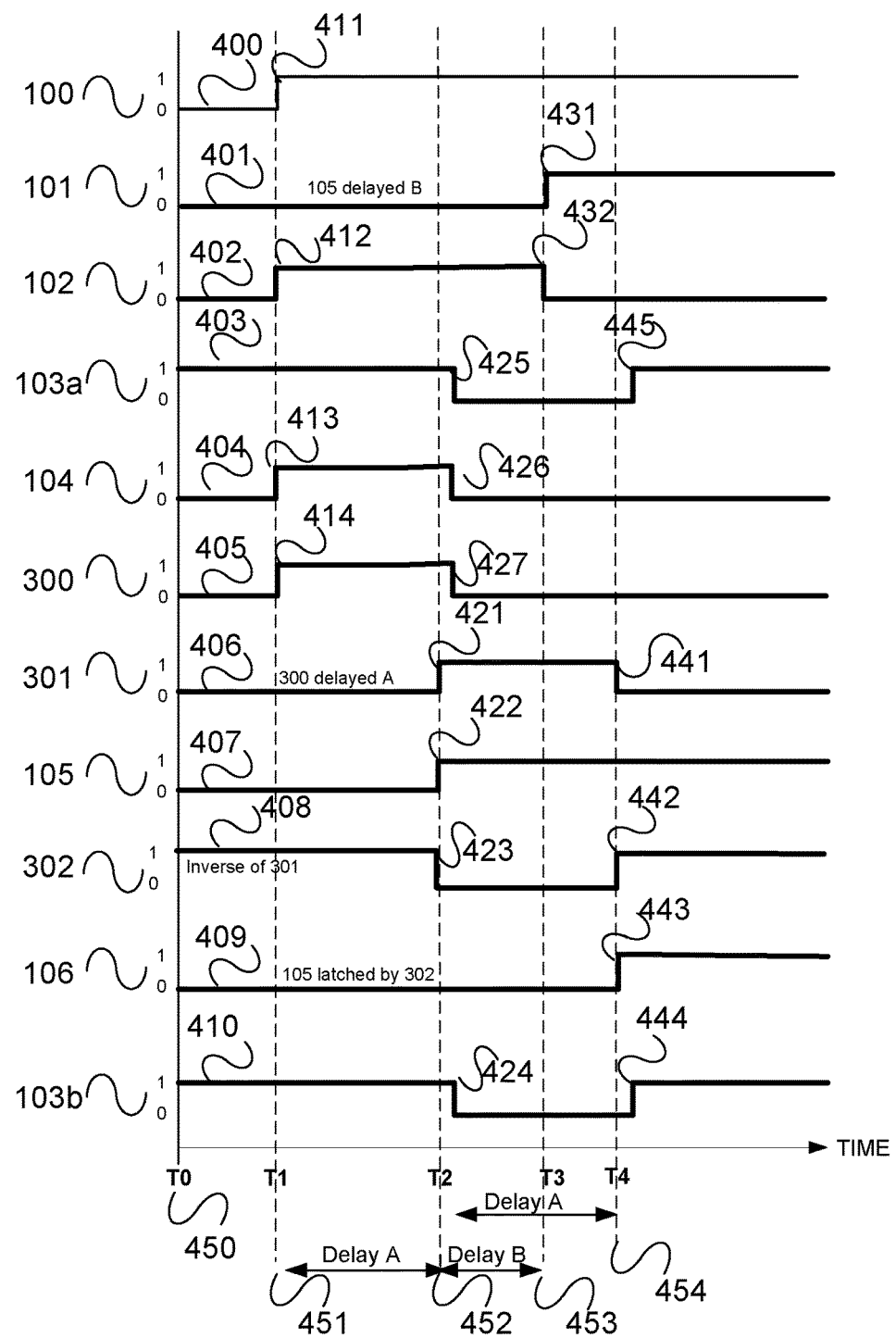
FIG. 8 is a timing diagram of various signals related to the chip interface showing a transition of one input state from low to high according to an embodiment of the invention.
Figure 9:
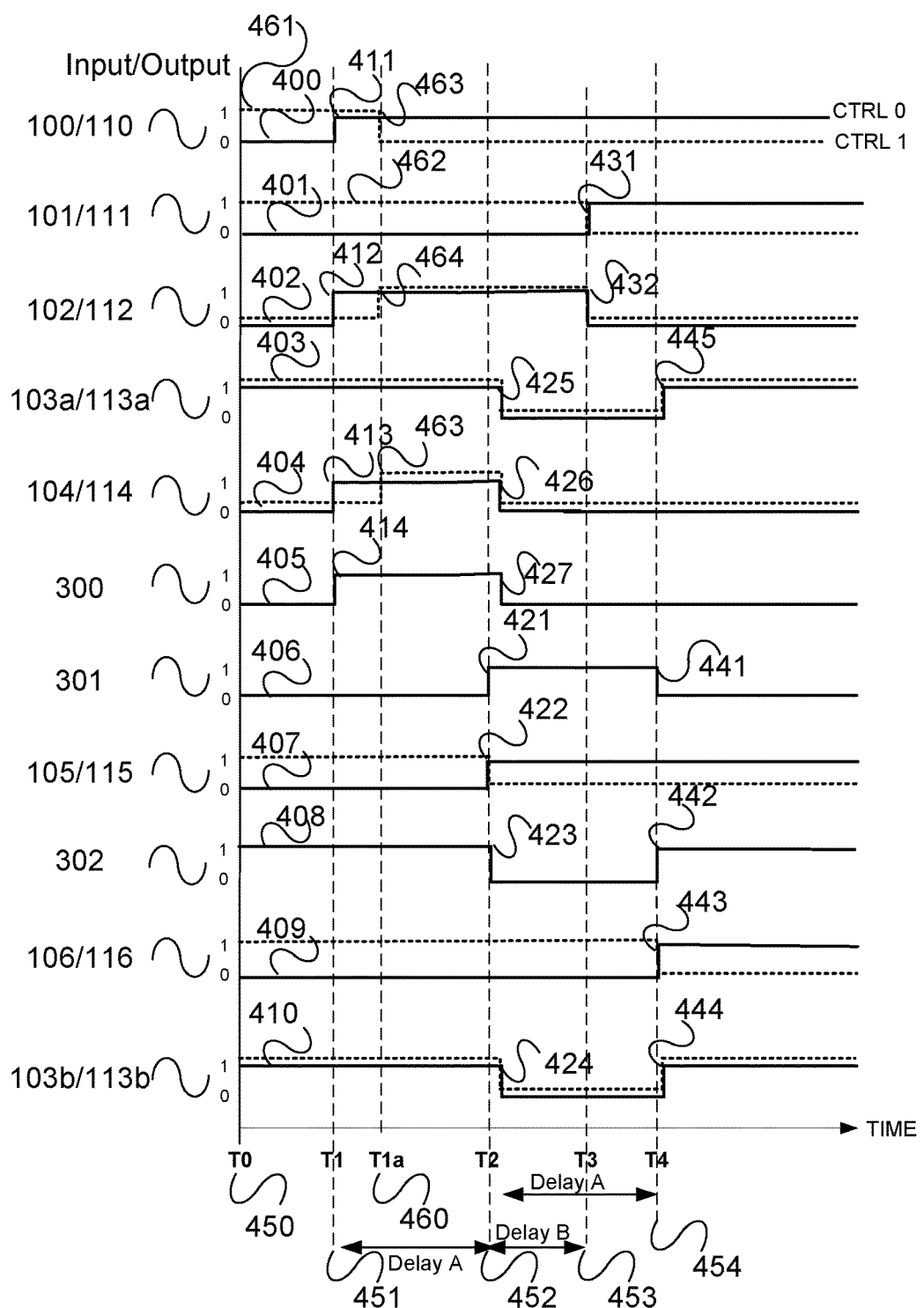
FIG. 9 is a timing diagram of various signals related to the chip interface showing a transitions of two input states according to an embodiment of the invention.
Figure 10:
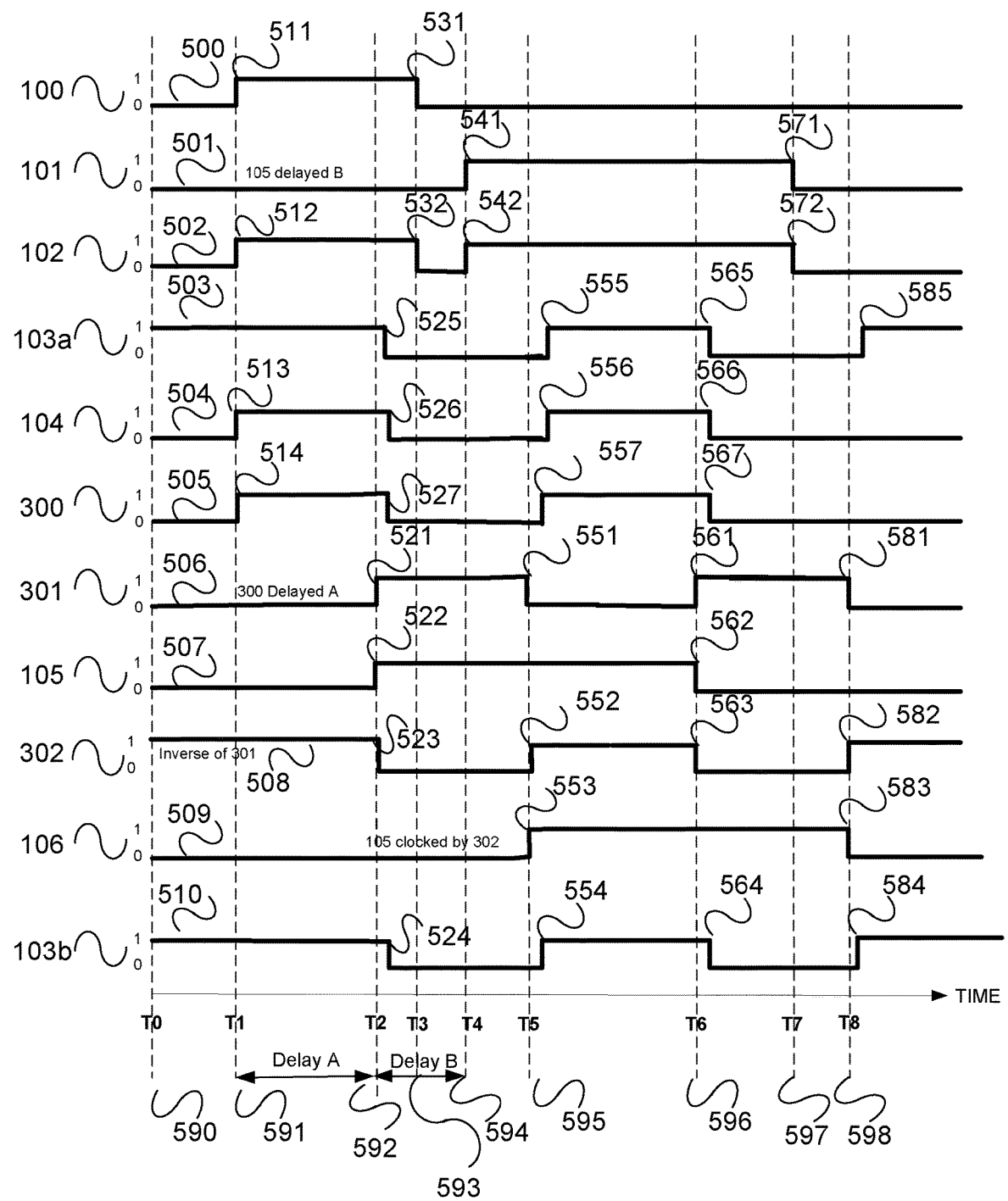
FIG. 10 is a timing diagram of various signals related to the chip interface showing a transition of one input state from low to high and back to low according to an embodiment of the invention.

FIGS. 8, 9 and 10 are logic timeline diagrams that describe the operation of the circuit schematic of the embodiment of the invention that is shown in FIG. 5 according to various embodiments of the invention. In FIGS. 8, 9 and 10, a low signal state is referred to as a 0, and a high signal state is referred to as a 1.

FIG. 8 is the logic timeline diagram for a transition on input CTRL 0, 31, from low to high. The horizontal axis is time and the vertical axis shows the input and output states of each connection as shown in FIG. 5. As the signal 103 is used in a feedback role, to aid the description of the logic diagrams the input 103 to AND gate 33 is termed 105, whereas the output 103 of EX-NOR gate 36 is termed 106.

At time T0, 450, the state of CTRL 0, 100 is at a 0, 400. This 400 is the steady state condition that is a result of a previous state change or setting. In the steady state, the output 105 of D-Latch 34, is also a 0, 407, as is the output 106 of D-Latch 35, 409.

Hence the output 106 of EX-NOR gate 36, will be a 1, 410, which is an input 105 to AND gate 33, 403. Also the output 101 of delay block 37 will be a 0, 401, as it is the delayed state of 105.

At time T0, 450, the two inputs 100 and 101 to EX-OR gate 32 are both 0, 400 and 401, and therefore the output 102 of EX-OR gate 32 is also a 0, 402. The two inputs 102 and 105 to AND gate 33 are 0, 402, and 1, 403, respectively, producing an output 104 which is a 0, 404. Output 104 is applied to the input of OR gate 60. The output 300 of OR gate 60 will also be a 0, 405. The output 301 of the delay block 61 will also be 0, 406 as in the steady state condition the delay caused by delay block 61 has long since passed. The output 302 of the inverter 62 will therefore be a 1, 408, the inverse of its input 406. The outputs, 307 to 311 of the logic block 63 will be set to the required states as defined by the three inputs 100, 110, 120 and the sampled outputs, 320 to 324 will be the same having been sampled previously.

At time T1, 451, the state of input 100 is changed from a 0 to a 1, 411. The inputs 100 and 101 to the EX-OR gate 32 will now be 1 and 0 respectively causing the output of the EX-OR gate 102 to be a 1, 412. The two inputs, 102 and 105 to AND gate 33 are now 1, 412, and 1, 403, causing the output 104 to be a 1, 413. This in turn causes the output 300 of OR gate 60 to be also a 1, 414. The output 301 of delay block 61 follows the input 300 delayed by a time as set by the delay.

Therefore at time T2, 452, where T2-T1 is the delay time of the delay block 61, the output 301 of the delay block 61 becomes a 1, 421. This transition from 0 to 1, 421, enables the D-Latch 34 causing the output 105 of the D-Latch 34 to be a 1 which is the input 100 to the D-Latch 34, 411. The inputs 105 and 106 to the EX-NOR gate 36 are now 1, 422, and 0, 409, respectively causing the output 106 of the EX-NOR gate 36 to transition from a 1 to a 0, 424.

Hence, the input 105 to AND gate 33 changes from a 1 to a 0, 425 causing the output 104 of the AND gate 33 to transition from a 1 to a 0, 426. The output 300 of the OR gate 60 will also transition from a 1 to a 0, 427.

At time T4, 454, where T4-T2 is the delay of the delay block 61, the output 301 of the delay block 61 will therefore transition from a 1 to a 0, 441. The output 302 of the inverter 62 is the inverse of the input 301 to the inverter 62 and hence output 302 will transition from a 0 to a 1, 442 at time T4, 454. This transition 442 is applied to the enable input of D-Latch 35 causing the output 106 of D-Latch 35 to transition from a 0 to a 1, 443. The inputs 105 and 106 to the EX-NOR gate 36 are now both 1 and hence the output 106 of the EX-NOR gate 36 transitions from a 0 to a 1, 444.

At time T3, 453, where T3-T2 is the delay time of the delay block 37, the output 101 of the delay block 37 will transition from a 0 to a 1, 431 which is a delayed transition of the output 105 of the D-Latch 34, 422. The inputs 100 and 101 to the EX-OR gate 32 are now both 1, hence the output 102 of the EX-OR gate 32 becomes a 0, 432.

At time T3, 453, the other input 105 to AND gate 33 is already a 0 425 so there is no change at the output 104 of the AND gate 33 which is a 0, 426. At time T4, 454, the output 302 of the inverter 62 transitions from a 0 to a 1, 442 and this transition is used to enable the output latches 64 through 68 which sample the output states 307 to 311 of the logic block 63 onto the sample outputs 320 to 324.

After time T4, 454, the inputs and outputs are all in steady state. The transition from 0 to 1, 411 of the input 100 for CTRL 0, 31 at time T1, 451, is sampled at time T2, 452 but the corresponding output states, 320 to 324 are not set until time T4, 454 after a check of the input and sampled states, 100 and 105, is carried out commencing at time T2, 452.

FIG. 9 is also the logic timeline diagram for a transition on input CTRL 0, 31, from low to high, but a transition on input CTRL 1, 41 from high to low is also shown. The horizontal axis is time and the vertical axis shows the input and output states of each connection as shown in FIG. 5.

The transitions and states of the inputs and outputs for the logic associated with the transition from 0 to 1, 411 of input 100 is exactly the same as shown and described in FIG. 9. In FIG. 10 a transition from 1 to 0, 463, of input 110, is also described.

At time T1a, 460, the state of input 110 is changed from a 1 to a 0, 463. The time T1a, 460, does not, in this example, coincide with the change 411 for input 100; it occurs a short time after.

At time T1, 451, the inputs 110 and 111 to the EX-OR gate 42 are both 1, 461 and 462, as set by the steady state condition that is a result of a previous state change or setting for input CTRL 1, 41.

At time T1a, 460, the input 110 transitions from a 1 to a 0, 463 causing the output 112 of EX-OR gate 42 to transition from a 0 to a 1, 464. This in turn causes the output 104 of AND gate 43 to transition from a 0 to a 1, 463.

The output 300 of OR gate 60 has already been set to a 1 by the transition 411 of the input CTRL 0, 31, hence as long as the transition 463 on CTRL 1, 41 takes place before time T2, 452, the sampling of the inputs, 100 and 105, and the sampling of the outputs, 307 to 311 are unchanged from that described in FIG. 8.

The output 301 of delay block 61 transitions from 0 to 1, 421, at time T2, 452 causing the sampling of the inputs, 100 and 110 at the D-Latches 35 and 45 respectively. The sampling of the outputs 105 and 115 of the D-latches 35 and 45 respectively also occur together at time T4, 454. Therefore, even though there is a time difference, T1 451 and T1a 460 between the transitions, 411 and 463 of the two inputs, the output settings 320 to 324 are sampled at exactly the same time by the output 302 of the inverter 62, 442.

FIG. 10 is again the logic timeline diagram for a transition on input CTRL 0, 31, from low to high, but in this case the input 100 transitions back from high to low. The horizontal axis is time and the vertical axis shows the input and output states of each connection as shown in FIG. 5.

At time T0, 590, the state of CTRL 0, 100 is at a 0, 500. This, 500, is the steady state condition that is a result of a previous state change or setting. In the steady state, the output 105 of D-Latch 34, is also a 0, 507, as is the output 106 of D-Latch 35, 509. Hence the output 106 of EX-NOR gate 36, will be a 1, 510, which is an input 105 to AND gate 33, 503. Also the output 101 of delay block 37 will be a 0, 501, as it is the delayed state of 105.

At time T0, 590, the two inputs 100 and 101 to EX-OR gate 32 are both 0, 500 and 501, and therefore the output 102 of EX-OR gate 32 is also a 0, 502. The two inputs 102 and 105 to AND gate 33 are 0, 502, and 1, 503, respectively, producing an output 104 which is a 0, 504. Output 104 is applied to the input of OR gate 60. The output 300 of OR gate 60 will also be a 0, 505. The output 301 of the delay block 61 will also be 0, 506, as in the steady state condition the delay caused by delay block 61 has long since passed. The output 302 of the inverter 62 will therefore be a 1, 508, the inverse of its input 506. The outputs, 307 to 311 of the logic block 63 will be set to the required states as defined by the three inputs 100, 110, 120 and the sampled outputs, 320 to 324 will be the same having been sampled previously.

At time T1, 591, the state of input 100 is changed from a 0 to a 1, 511. The inputs 100 and 101 to the EX-OR gate 32 will now be 1 and 0 respectively causing the output of the EX-OR gate 102 to be a 1, 512. The two inputs, 102 and 105 to AND gate 33 are now 1, 512, and 1, 503, causing the output 104 to be a 1, 513. This in turn causes the output 300 of OR gate 60 to be also a 1, 514.

The output 301 of delay block 61 follows the input 300 delayed by a time as set by the delay. Therefore at time T2, 592, where T2-T1 is the delay time of the delay block 61, the output 301 of the delay block 61 becomes a 1, 521. This transition from 0 to 1, 521, enables the D-Latch 34 causing the output 105 of the D-Latch 34 to be a 1, 522, which is the input 100 to the D-Latch 34, 511. The inputs 105 and 106 to the EX-NOR gate 36 are now 1, 522, and 0, 509, respectively, causing the output 106 of the EX-NOR gate 36 to transition from a 1 to a 0, 524.

Hence, the input 105 to AND gate 33 changes from a 1 to a 0, 525 causing the output 104 of the AND gate 33 to transition from a 1 to a 0, 526. The output 300 of the OR gate 60 will also transition from a 1 to a 0, 527.

At time T5, 595, where T5-T2 is the delay of the delay block 61, the output 301 of the delay block 61 will therefore transition from a 1 to a 0, 551. The output 302 of the inverter 62 therefore transitions from a 0 to a 1, 552, which is applied to the enable input of D-Latch 35. The output 106 of D-Latch 35 therefore becomes the same as the input 105 and transitions from a 0 to a 1, 553. As the two inputs 105 and 106 to the EX-NOR gate 36 are now both 1, 522 and 523, the output 106 will transition from a 0 to a 1, 554.

At time T3, 593, the input state 100 changes back from a 1 to a 0, 531. The other input 101 to EX-OR gate 32 is still a 0, 501 and hence the output 102 of EX-OR gate 33 transitions from a 1 to a 0, 532. As input 105 to AND gate 33 is a 0, 525, this transition of the output 102 of EX-OR gate 32 does not cause any change to the output 104 of the AND gate 33.

At time T4, 594, however, the output 101 of delay block 37 will transition from a 0 to a 1, 541 which is the delayed transition of the output 522 of the D-Latch 34 which occurred at time T2, 592. The time T4-T2 is the delay time of the delay block 37. At time T4, 594, the output 102 of the EX-OR gate 32 will transition back form a 0 to a 1, 542. As input 105 to AND gate 33 is a 0, 525, this transition of the output 102 of EX-OR gate 32 does not cause any change to the output 104 of the AND gate 33.

At time T5, 595, the output 106 of EX-NOR gate 36 transitions from a 0 to a 1, 554. The inputs 102 and 105 to AND gate 33 are now both 1, 542 and 555 causing the output 104 to transition to a 1, 556. The output 300 of NOR gate 60 will also transition from a 0 to a 1, 557.

At time T6, 596, the output 301 of the delay block 61 will then also transition from a 0 to a 1, 561. Time T6-T5 is equal to the delay provided by delay block 61. This transition 561 is applied to the enable input 301 of D-Latch 34 and the signal at the input 100 of the D-Latch 34 is sampled and appears on the output 105. Hence the output 105 of the D-Latch 34 will change from a 1 to a 0, 562.

At time T6, 596, the output 302 of inverter 62 will transition from a 1 to a 0, 563. The inputs 105 and 106 of EX-NOR gate 36 are now 0 and 1 respectively, causing the output 106 of EX-NOR gate 36 to transition from a 1 to a 0. The inputs 105 and 102 to AND gate 33 are 0, 565, and 1, 542, causing the output 104 of AND gate 33 to transition from a 1 to a 0, 566. The output 300 of OR gate 60 will also transition from a 1 to a 0, 567.

At time T8, 598, output 301 of delay block 61 will follow the input 300 and transition from a 1 to a 0, 581. Time T8-T6 is equal to the delay provided by delay block 61. The output 302 of the inverter 62 will therefore transition from a 0 to a 1, 582. This transition is applied to the enable input of D-Latch 35 and the output 106 of the D-Latch 35 will therefore sample the input 105 and output 106 will transition from a 1 to a 0, 583. The effect is that output 106 of the EX-NOR gate 36 will transition to a 1, 584.

At time T7, 597, where T7-T6 is equal to the delay provided by delay block 37, the output 101 of delay block 37 will transition from a 1 to a 0, 571 and the output 102 of EX-OR gate 32 will also transition to a 0, 572. As input 105 to AND gate 33 is a 0, 525, this transition of the output 102 of EX-OR gate 32 does not cause any change to the output 104 of the AND gate 33.

At a time just after T8, 598, the steady state condition is achieved. The transitions 552 and 582 from 0 to 1 of the output 302 of the inverter 62 sample the outputs 307 to 311 of the logic block 63. Note that the first sampling 552 occurs at time T5, 595 which is at time equal to twice the delay time inserted by delay block 61 after the initial transition of the input 100 at time T1, 591. As long as the input 100 has settled before a time of twice the delay of block 67, then the output transitions 320 to 324 will be glitch free.

In FIG. 8 the single pulse 422 generated at time T1, 413, until time T2, 426 at the output 104 of the AND gate 33 is reproduced at time T2, 452, at the output of the delay block 61 and also, in an inverted state, at the output of inverter 62. This pulse is used to sample the input condition 100 and confirm that it is stable before sampling the output states, 307 to 311. In FIG. 10 as well as the pulse generate at time T1, 413, until time T2, 426 at the output 104 of the AND gate 33, there is a second pulse generated at time T5, 595 until time T6, 596. This second pulse is generated because at time T5, 595, the input condition 100 was not the same as the sampled condition 105 and a steady state condition was not achieved which would cause problems with any subsequent input changes. After the second pulse has traversed through the logic, as described above, the steady state condition is reached with the input 101 to EX-OR gate 32 being the same as the latest input 100, and the input 105 to AND gate 33 being at a 1.

Figure 11:
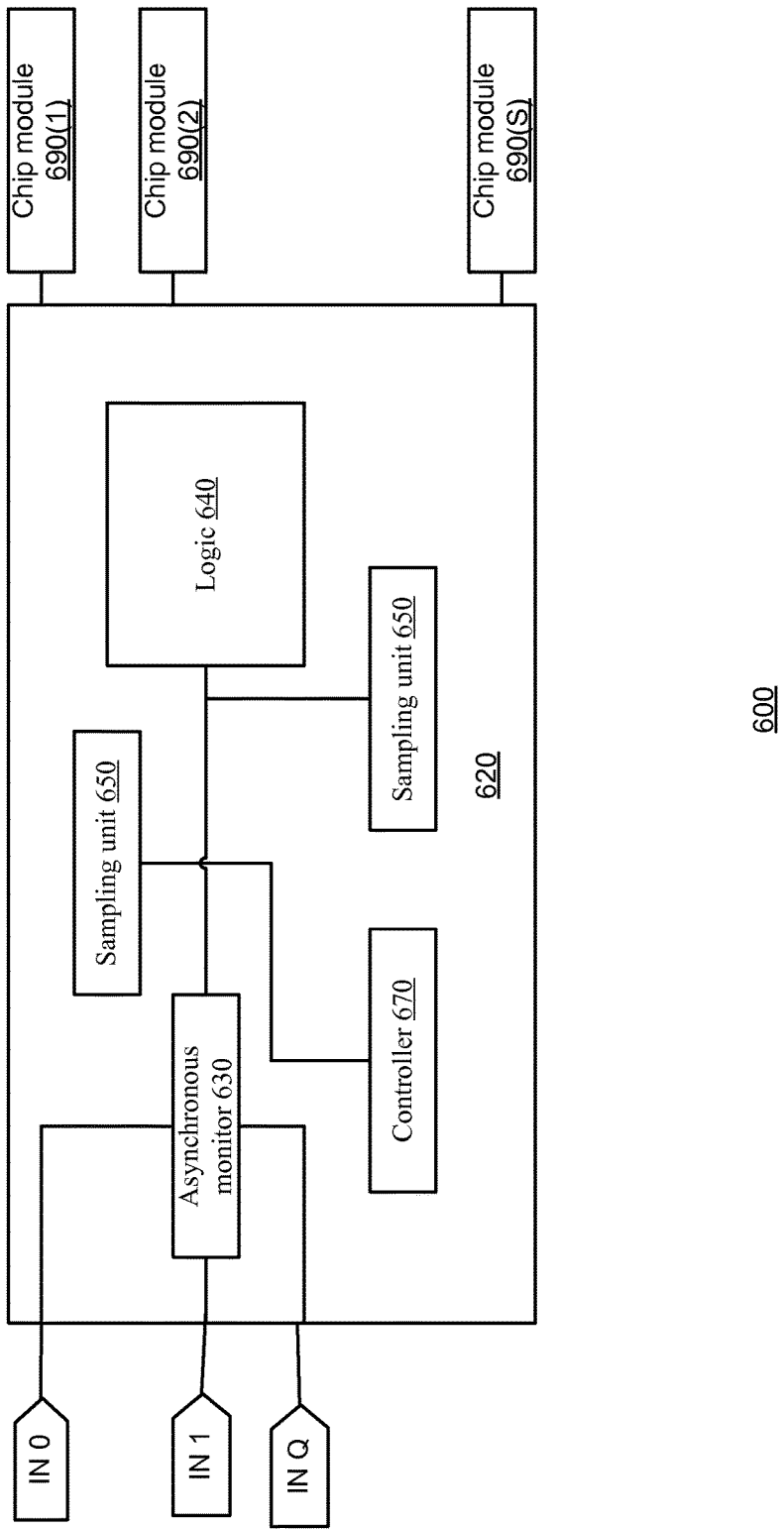
FIG. 11 illustrates a chip according to an embodiment of the invention.

FIG. 11 illustrates a chip 600 according to an embodiment of the invention.

Chip 600 includes input terminals 601(1)-601(Q), a chip interface 620 and chip modules 690(1)-690(S) that differ from the chip interface 620. Q and S are positive integers. S usually exceeds Q but this is not necessarily so.

Chip interface 620 includes asynchronous monitor 630, logic 640, sampling unit 650, delay unit 660 and controller 670.

Asynchronous monitor 630 is configured to detect a change in a state of input signals conveyed over the input terminals 601(1)-601(Q) and to generate a first pulse.

Delay unit 660 is configured to generate, at a first delay period after a reception of the first pulse, a first sampling pulse.

Logic 640 is configured to decode the input signals, to provide output signals that are indicative of configurations of the chip modules.

Sampling unit 650 is configured to sample, in response to the first sampling pulse, a state of the input signals to provide a first sampled state of the input signals.

Delay unit 600 is also configured to generate, at a second delay period after the generation of the first sampling pulse, a second sampling pulse.

Sampling unit 640 is also configured to sample, in response to the second sampling pulse, (i) the state of the input signals to provide a second sampled state of the input signals, and (ii) a state of the output signals to provide a first sampled state of the output signals.

Controller 670 is configured to (i) compare between the first sampled state of the input signals and the second sampled state of the input signals; and (ii) output the sampled state of the output signals only when the first sampled state of the input signals equals the second sampled state of the input signals.

It is noted that logic 640 may be any combination of logical circuits configured to decode or to otherwise convert the input signals to output signals for configuring chip modules 690(1)-690(S).

It is noted that asynchronous monitor 630, logic 640, sampling unit 650, delay unit 660 and controller 670 may be discrete circuits that do not share any component but that at least one out of asynchronous monitor 630, logic 640, sampling unit 650, delay unit 660 and controller 670 may share one or more components.

According to an embodiment of the invention logic 640, sampling unit 650 and controller 670 are asynchronous. These circuits are not fed by a clock signals and their power consumption may be much lower than those of synchronous circuits that perform the same function.

Asynchronous monitor 630 may be configured to detect the change in a state of input signals by comparing each input signal to a delayed version of the input signal.

Figure 3:
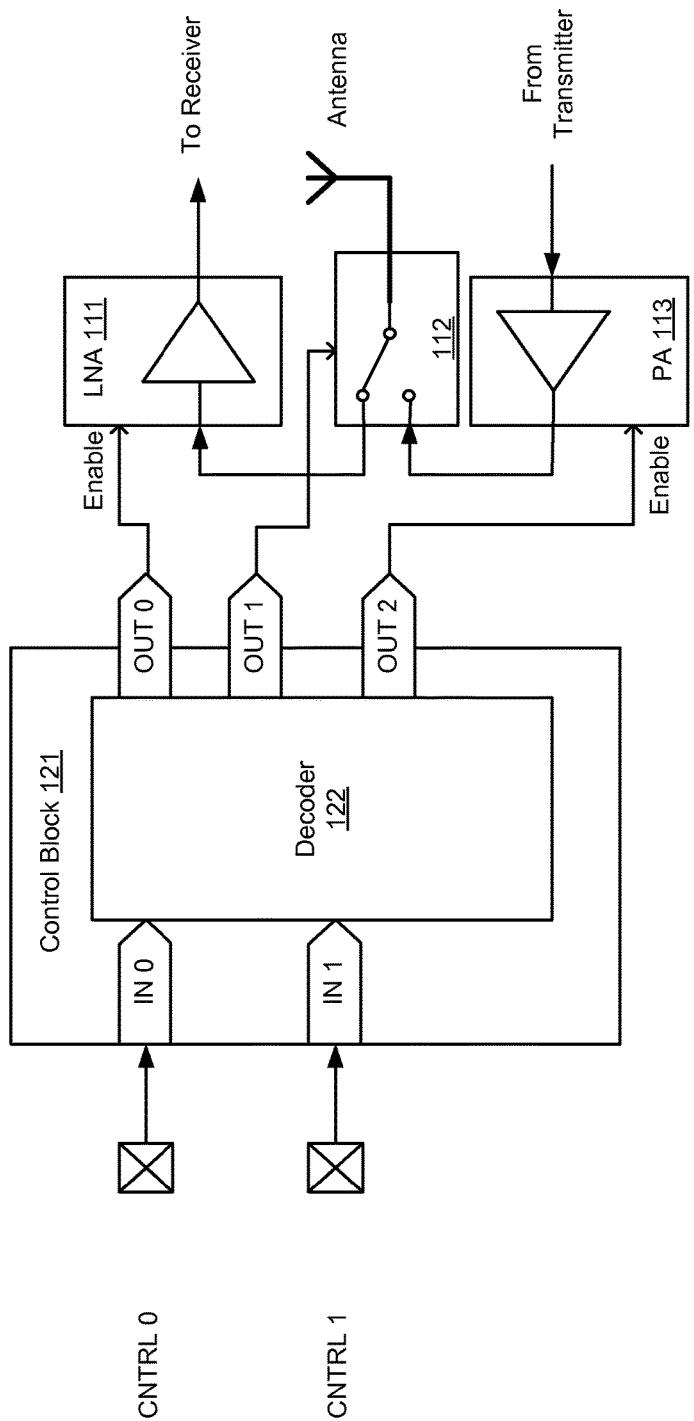
FIG. 3 illustrates a prior art chip interface.

According to an embodiment of the invention chip interface 620 may include multiple input paths and multiple output paths, wherein each input path of the multiple input paths is allocated for a single input signal of the input signals. FIG. 3 illustrates three input paths and N output paths. The N output paths include flip-flops (D-latches) 64, 65, 66 and 68.

According to an embodiment of each input path may include an exclusive OR (XOR) logical gate, an OR gate, a first flip-flop, a second flip-flop, a not-XOR (NXOR) gate and a path delay circuit; wherein each output path of the multiple output paths is allocated for a single output signal of the output signals. The multiple input paths, and an additional circuit form the asynchronous monitor, the sampling unit, the delay unit and the controller. This is illustrated in FIG. 3. For example, a first input path includes components 32, 33, 34, 35, 36 and 37.

Figure 12:
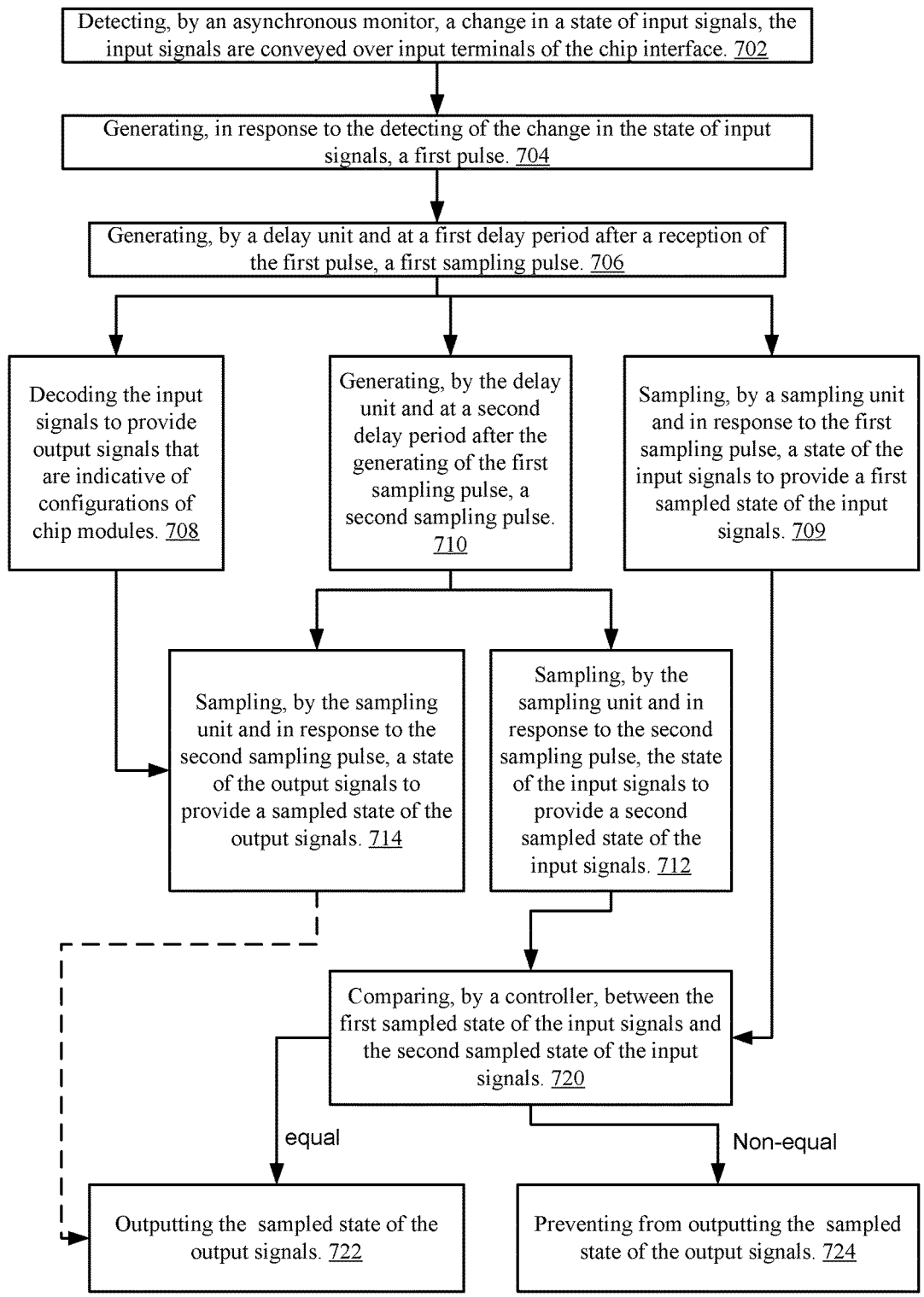
FIG. 12 illustrates a method according to an embodiment of the invention.

FIG. 12 illustrates method 700 according to an embodiment of the invention.

Method 700 may start by step 702 of detecting, by an asynchronous monitor, a change in a state of input signals, the input signals are conveyed over input terminals of the chip interface.

Step 702 may be followed by step 704 of generating, in response to the detecting of the change in the state of input signals, a first pulse.

Step 704 may be followed by step 706 of generating, by a delay unit and at a first delay period after a reception of the first pulse, a first sampling pulse.

Step 706 may be followed by step 708 of decoding the input signals to provide output signals that are indicative of configurations of chip modules.

Step 706 may also be followed by step 709 of sampling, by a sampling unit and in response to the first sampling pulse, a state of the input signals to provide a first sampled state of the input signals.

Step 706 may also be followed by step 710 of generating, by the delay unit and at a second delay period after the generating of the first sampling pulse, a second sampling pulse.

Step 710 may be followed by step 712 of sampling, by the sampling unit and in response to the second sampling pulse, the state of the input signals to provide a first sampled state of the input signals.

Step 710 may also be followed by step 714 of sampling, by the sampling unit and in response to the second sampling pulse, a state of the output signals to provide a first sampled state of the output signals. The output signals were provided during step 708.

Steps 709 and 712 may be followed by step 720 of comparing, by a controller, between the first sampled state of the input signals and the second sampled state of the input signals.

If the first sampled state of the input signals equals ("equals") the second sampled state of the input signals then step 720 is followed by step 722 of outputting the first sampled state of the output signals (sampled during step 714—as illustrated by a dashed line that connects boxes 714 and 722).

If the first sampled state of the input signals differs ("non-equal") from the second sampled state of the input signals then step 720 is followed by step 724 of preventing from outputting the first sampled state of the output signals. The previously outputted state of the output signals remains unchanged.

While the above description contains many specificities, these should not be construed as limitations on the scope, but rather as an exemplification of one of embodiment thereof. Many other variations are possible. For example other logic gates may be used in the circuit and variations as to the number of inputs and outputs may vary. Accordingly the scope should be determined not by the embodiment illustrated but by the appended claims and their legal equivalents.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A chip, comprising: input terminals, a chip interface and chip modules that differ from the chip interface;
   wherein the chip interface comprises an asynchronous monitor, logic, a sampling unit, a delay unit and a controller;
   wherein the asynchronous monitor is configured to detect a change in a state of input signals conveyed over the input terminals and to generate a first pulse;
   wherein the delay unit is configured to generate, at a first delay period after a reception of the first pulse, a first sampling pulse;
   wherein the logic is configured to decode the input signals, to provide output signals that are indicative of configurations of the chip modules;
   wherein the sampling unit is configured to sample, in response to the first sampling pulse, a state of the input signals to provide a first sampled state of the input signals;
   wherein the delay unit is configured to generate, at a second delay period after the generation of the first sampling pulse, a second sampling pulse;
   wherein the sampling unit is configured to sample, in response to the second sampling pulse, (i) the state of the input signals to provide a second sampled state of the input signals, and (ii) a state of the output signals to provide a first sampled state of the output signals;
   wherein the controller is configured to (i) compare between the first sampled state of the input signals and the second sampled state of the input signals; and (ii) output the sampled state of the output signals only when the first sampled state of the input signals equals the second sampled state of the input signals.

2. The chip according to claim 1, wherein the logic, the sampling unit and the controller are asynchronous.

3. The chip according to claim 1, wherein the asynchronous monitor is configured to detect the change in a state of input signals by comparing each input signal to a delayed version of the input signal.

4. The chip according to claim 1, wherein the chip interface comprises multiple input paths and multiple output paths, wherein each input path of the multiple input paths is allocated for a single input signal of the input signals; wherein each input path comprises an exclusive OR (XOR) logical gate, an OR gate, a first flip-flop, a second flip-flop, a not-XOR (NXOR) gate and a path delay circuit; wherein each output path of the multiple output paths is allocated for a single output signal of the output signals; wherein the multiple input paths, and an additional circuit form the asynchronous monitor, the sampling unit, the delay unit and the controller.

5. The chip according to claim 4, wherein the additional circuit comprises a first delay circuit that is configured to introduce the first delay period; wherein each path delay circuit is configured to introduce the second delay period; wherein the first delay circuit and path delay circuits of the multiple input paths form the delay unit.

6. The chip according to claim 5, wherein the additional circuit comprises an inverter that has an input that is coupled to an output of the first delay circuit.

7. The chip according to claim 6, wherein for each input path a first input of the XOR gate is coupled to an input terminal that is associated with the input path; a second input of the XOR is coupled to an output of the path delay circuit; an output of the XOR gate is coupled to a first input of the OR gate; a second input of the OR gate is coupled to an output of the NXOR gate; an output of the OR gate is coupled to an input of an additional circuit OR gate; a data port of the first flip-flop is coupled to the input terminal that is associated with the input path; an enable port of the first flip-flop is coupled to an output of the first delay circuit; an output port of the first flip-flip is coupled to a data port of the second flip-flop, to a first input of the NXOR gate and to an input port of the logic; wherein an enable port of the second flip-flop is coupled to an output of the inverter; and wherein an output port of the second flip-flip is coupled to a second input of the NXOR gate.

8. The chip according to claim 1, wherein the logic is configured to start decoding the input signals at a point in time that does not precede a time of generation of the first sampling pulse.

9. A chip, comprising: input terminals for conveying input signals, a chip interface and chip modules that differ from the chip interface;
wherein the chip interface comprises multiple input paths, multiple output paths, logic coupled between the multiple input paths and the multiple output paths, and an additional circuit;
wherein each input path of the multiple input paths is allocated for a single input signal of the input signals;
wherein each input path comprises an exclusive OR (XOR) logical gate, an OR gate, a first flip-flop, a second flip-flop, a not-XOR (NXOR) gate and a path delay circuit; wherein each output path of the multiple output paths is allocated for a single output signal of the output signals;
wherein the additional circuit comprises a first delay circuit that is configured to introduce a first delay period and inverter that has an input that is coupled to an output of the first delay circuit;
wherein each path delay circuit is configured to introduce a second delay period;
wherein the logic is configured to decode the input signals to provide output signals that are indicative of configurations of the chip modules;
wherein for each input path:
a first input of the XOR gate is coupled to an input terminal that is associated with the input path;
a second input of the XOR is coupled to an output of the path delay circuit; an output of the XOR gate is coupled to a first input of the OR gate;
a second input of the OR gate is coupled to an output of the NXOR gate;
an output of the OR gate is coupled to an input of an additional circuit OR gate;
a data port of the first flip-flop is coupled to the input terminal that is associated with the input path;
an enable port of the first flip-flop is coupled to an output of the first delay circuit; an output port of the first flip-flip is coupled to a data port of the second flip-flop, to a first input of the NXOR gate and to an input port of the logic;
wherein an enable port of the second flip-flop is coupled to an output of the inverter; and
wherein an output port of the second flip-flip is coupled to a second input of the NXOR gate.

10. The chip according to claim 9, wherein the first flip-flop, the second flip flops and the logic are asynchronous.

11. A method, comprising:
detecting, by an asynchronous monitor, a change in a state of input signals, the input signals are conveyed over input terminals of a chip interface;
generating, in response to the detecting of the change in the state of input signals, a first pulse;
generating, by a delay unit and at a first delay period after a reception of the first pulse, a first sampling pulse;
decoding the input signals to provide output signals that are indicative of configurations of chip modules;
sampling, by a sampling unit and in response to the first sampling pulse, a state of the input signals to provide a first sampled state of the input signals;
generating, by the delay unit and at a second delay period after the generating of the first sampling pulse, a second sampling pulse;
sampling, by the sampling unit and in response to the second sampling pulse, the state of the input signals to provide a second sampled state of the input signals;
sampling, by the sampling unit and in response to the second sampling pulse, a state of the output signals to provide a sampled state of the output signals;
comparing, by a controller, between the first sampled state of the input signals and the second sampled state of the input signals; and
outputting the sampled state of the output signals only when the first sampled state of the input signals equals the second sampled state of the input signals; and
wherein the asynchronous monitor, the delay unit and the sampling unit belong to a chip interface.

12. The method according to claim 11, wherein the logic, the sampling unit and the controller are asynchronous.

13. The method according to claim 11, wherein the detecting of the change of the state of input signals comprises comparing each input signal to a delayed version of the input signal.

14. The method according to claim 11, wherein the chip interface comprises multiple input paths and multiple output paths, wherein each input path of the multiple input paths is allocated for a single input signal of the input signals; wherein each input path comprises an exclusive OR (XOR) logical gate, an OR gate, a first flip-flop, a second flip-flop, a not-XOR (NXOR) gate and a path delay circuit; wherein each output path of the multiple output paths is allocated for a single output signal of the output signals; wherein the multiple input paths, and an additional circuit form the asynchronous monitor, the sampling unit, the delay unit and the controller.

15. The method according to claim 14, wherein the additional circuit comprises a first delay circuit that is configured to introduce the first delay period; wherein each path delay circuit is configured to introduce the second delay period; wherein the first delay circuit and path delay circuits of the multiple input paths form the delay unit.

16. The method according to claim 15, wherein the additional circuit comprises an inverter that has an input that is coupled to an output of the first delay circuit.

17. The method according to claim 16, wherein for each input path a first input of the XOR gate is coupled to an input terminal that is associated with the input path; a second input of the XOR is coupled to an output of the path delay circuit; an output of the XOR gate is coupled to a first input of the OR gate; a second input of the OR gate is coupled to an output of the NXOR gate; an output of the OR gate is coupled to an input of an additional circuit OR gate; a data port of the first flip-flop is coupled to the input terminal that is associated with the input path; an enable port of the first flip-flop is coupled to an output of the first delay circuit; an output port of the first flip-flip is coupled to a data port of the second flip-flop, to a first input of the NXOR gate and to an input port of the logic; wherein an enable port of the second flip-flop is coupled to an output of the inverter; and wherein an output port of the second flip-flip is coupled to a second input of the NXOR gate.

18. The method according to claim 11, wherein the decoding of the input signals start at a point in time that does not precede a time of generation of the first sampling pulse.

* * * * *